United States Patent
Chatroux et al.

(10) Patent No.: US 9,778,307 B2
(45) Date of Patent: Oct. 3, 2017

(54) INSULATION FAULT DETECTION DEVICE FOR TESTING FOR INSULATION FAULTS UNDER CRITICAL CONDITIONS

(71) Applicant: COMMISSARIAT A L'ENERGIE ATOMIQUE ET AUX ENERGIES ALTERNATIVES, Paris (FR)

(72) Inventors: Daniel Chatroux, Teche (FR); Sebastien Carcouet, Vif (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 42 days.

(21) Appl. No.: 14/915,029

(22) PCT Filed: Sep. 10, 2014

(86) PCT No.: PCT/EP2014/069330
§ 371 (c)(1),
(2) Date: Feb. 26, 2016

(87) PCT Pub. No.: WO2015/036456
PCT Pub. Date: Mar. 19, 2015

(65) Prior Publication Data
US 2016/0209453 A1 Jul. 21, 2016

(30) Foreign Application Priority Data
Sep. 13, 2013 (FR) ...................... 13 58868

(51) Int. Cl.
G01R 31/00 (2006.01)
B60L 3/00 (2006.01)
G01R 31/02 (2006.01)

(52) U.S. Cl.
CPC .......... *G01R 31/006* (2013.01); *B60L 3/0069* (2013.01); *G01R 31/025* (2013.01)

(58) Field of Classification Search
CPC combination set(s) only.
See application file for complete search history.

(56) References Cited

U.S. PATENT DOCUMENTS

2007/0001684 A1* 1/2007 Kawamura ........ G01R 19/2503
324/522
2010/0156426 A1 6/2010 Kang et al.

FOREIGN PATENT DOCUMENTS

FR 2 297 427 A1 8/1976
FR 2 976 083 A1 12/2012

OTHER PUBLICATIONS

International Search Report Issued Oct. 20, 2014 in PCT/EP14/69330 Filed Sep. 10, 2014.

* cited by examiner

*Primary Examiner* — Clayton E Laballe
*Assistant Examiner* — Jas Sanghera
(74) *Attorney, Agent, or Firm* — Oblon, McClelland, Maier & Neustadt, L.L.P.

(57) ABSTRACT

A device including a bridge assembly including: first, second, third, and fourth nodes, the first and third nodes being connected to a direct voltage source; a first branch connecting the first and second nodes; a second branch connecting the second and third nodes; a third branch connecting the first and fourth nodes; a fourth branch connecting the third and fourth nodes; a fifth branch connecting the second and fourth nodes and including a capacitor connected between the second and fourth nodes; a circuit controlling the switches to successively a) close the switches to charge the capacitor, and b) keep one switch closed and the other switches open; a measuring circuit measuring the current flowing through the capacitor; and a circuit determining magnitude of an insulation fault according to a current measured during b).

10 Claims, 4 Drawing Sheets

INSULATION FAULT DETECTION DEVICE FOR TESTING FOR INSULATION FAULTS UNDER CRITICAL CONDITIONS

The invention relates to the insulation of a DC electrical power supply with respect to earth and, in particular, the detection of an insulation fault for a high-power electrical power supply.

High-power DC electrical systems are currently the object of significant development efforts. The reason for this is that many transport systems include a DC power supply.

Hybrid combustion/electric or electric vehicles notably include high-power batteries. In order to obtain the adequate level of voltage, several electrochemical accumulators are placed in series. In order to obtain high powers and capacities, several groups of accumulators are placed in parallel. The number of stages (number of groups of accumulators in series) and the number of accumulators in parallel within each stage vary as a function of the voltage, of the current and of the desired capacity for the battery. The association of several accumulators is called a battery of accumulators.

The electrochemical accumulators used for such vehicles are generally of the lithium ion type for their capacity to store a large amount of energy with a limited weight and volume. The battery technologies of the iron phosphate LiFePO4 Lithium ion type are currently the object of significant developments owing to their intrinsic high level of safety, to the detriment of a slightly lower energy storage density.

Such batteries are used to drive an AC electric motor by means of an inverter. The levels of voltage needed for such motors reach several hundreds of Volts, typically of the order of 400 Volts. These batteries also comprise a high capacity in order to favor the autonomy of the vehicle in electric mode.

The circuit diagram for connection to the earth of a power battery of an automobile vehicle usually corresponds to an IT neutral configuration of an electrical line supply, in other words with an isolated neutral with respect to the earth and a mechanical ground connected to the earth (except when being driven where the mechanical ground is insulated from the earth by means of the tires).

Several technical reasons specific to automobile applications thus lead to the use of an insulation between the mechanical ground of the vehicle (formed by the chassis and the metal bodywork of the vehicle, and hence accessible to the user) and the potentials of the battery. The main reason is that it cannot be envisioned, when a first insulation fault occurs while driving, to instantaneously disconnect the drive battery. For example, in the case where one of the poles of the battery is connected to the mechanical ground and where the insulation fault occurs on the other pole, this results in a short-circuit and the immediate blowing of the protection fuse. This would have the effect of rendering the vehicle dangerous, owing to the disappearance of the drive power or of the energy recovery braking. This then makes it necessary to insulate the battery and to monitor this insulation for reasons of personal safety by an insulation monitor. Indeed, if, when a first fault occurs, there is no risk for the user, a warning should be given to him of this first fault before the appearance of a second fault having the effect of disconnecting the drive battery since it causes a short-circuit between the positive and negative terminals of the battery. In addition, when this second fault occurs, the voltage of the battery would be directly connected to the mechanical ground of the vehicle and the user would therefore potentially be in contact with the latter. Owing to the potential risk of such a source of energy for the users, particular care must be taken with the isolation and the monitoring of the isolation between the battery and the mechanical ground. All parts of the vehicle electrically connected to the battery must be insulated with respect to the grounds. This insulation is effected by the use of insulating materials. The insulation may deteriorate over time (due to vibrations, mechanical impacts, dust and dirt, etc.), and hence apply a dangerous potential to the mechanical ground.

Furthermore, it may be envisioned to use a charger not galvanically isolated from the electrical line supply. Since the mechanical ground of the vehicle is normatively connected to the earth during recharging and the neutral configuration conventionally used (TT configuration) in residential mode connects the neutral to the earth, this corresponds to connecting the mechanical ground of the vehicle to one of the potentials of the battery during recharging operations. During these recharging operations, the full voltage of the battery is therefore applied to the terminals of the insulation in contrast to the nominal case where only half of this voltage is applied and, above all, controlled. This insulation could be incapable of handling the full voltage instantaneously creating a second fault resulting in a short-circuit.

The known devices for detecting insulation faults are not designed to anticipate a failure of the insulation in the presence of a potential difference between a terminal and ground higher than this potential difference in normal operation. These devices do not therefore test the insulation fault under its critical conditions of occurrence. Furthermore, the majority of the devices for detecting insulation faults lead to a non-negligible electrical power consumption, with a consequence on the autonomy of the vehicle.

The document FR2976083 describes an insulation device comprising a bridge configuration with a respective controlled switch in four branches, a detection circuit being installed in a fifth bridge-configured branch. A control circuit keeps the switches open with a duty cycle so as to limit the current consumption.

The document US2010/156426 describes a circuit for detecting an insulation fault between a source of DC voltage and an electrical ground. A bridge circuit equipped with controlled switches is connected, on the one hand, to ground and, on the other hand, sequentially to each terminal of a source of DC voltage.

The invention aims to solve one or more of these drawbacks. The invention thus relates to a device for detecting an insulation fault between a source of DC voltage and an electrical ground, such as that defined in the appended claims.

The invention also relates to a system such as that defined in the appended claims.

Other features and advantages of the invention will become more clearly apparent from the description presented hereinafter, by way of non-limiting example, with reference to the appended drawings, characterized in that:

Figure 1:
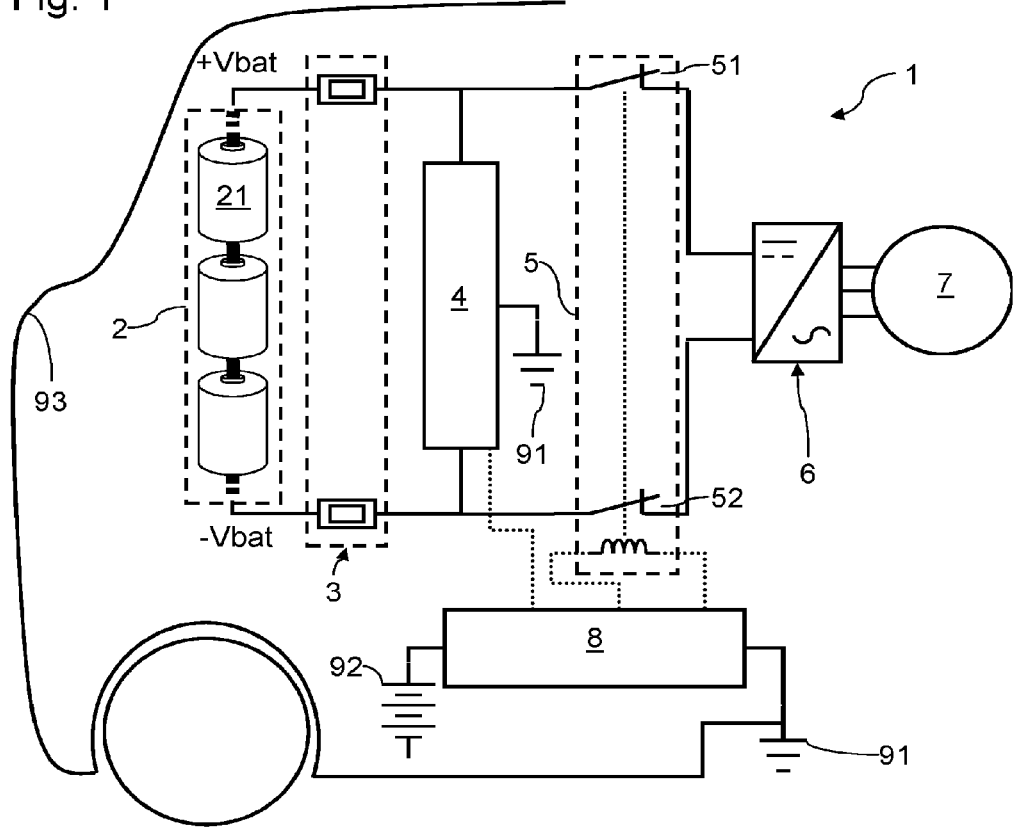
FIG. 1 is a schematic representation of one example of a vehicle with an electric motor powered by a battery.

FIG. 1 illustrates an example of a vehicle 1 implementing one embodiment of the invention. The vehicle 1 is an electric vehicle comprising, in a manner known per se, a battery 2 including electrochemical accumulators 21 connected in series. The battery 2 comprises a large number of accumulators 21 connected in series, typically between 40 and 150 accumulators depending on the voltage required and on the type of accumulators used. The voltage across the terminals of the fully charged battery 2 is typically around 400 V. The battery 2 applies a voltage +Vbat on a first terminal, and a voltage −Vbat on a second terminal. The accumulators 21 are connected in series via high-power electrical connections. The terminals of the battery 2 are connected to a DC interface of an inverter 6. An electric motor 7 is connected to an AC interface of the inverter 6.

The connection between the terminals of the battery 2 and the DC interface of the inverter 6 is made via a protection circuit 3 and via a power coupling circuit 5. In a manner known per se, the protection circuit 3 can comprise fuses configured for opening the connection when there is a short-circuit. The power coupling circuit 5 comprises switches 51 and 52 allowing the terminals of the battery 2 to be selectively connected/disconnected to/from the DC interface of the inverter 6. The opening/closing of the switches 51 and 52 is controlled by a control circuit 8, typically a computer for supervision of the operation of the battery 2. The control circuit 8 is typically powered by means of a battery 92 for the power supply of the onboard system of the vehicle 1, having a much lower voltage level than that of the battery 2. The control circuit 8 is typically connected to the mechanical ground 91, including the metal chassis and bodywork 93 of the vehicle 1. A device for detecting an insulation fault 4 is connected to the terminals of the battery 2 and to the mechanical ground 91.

Figure 2:
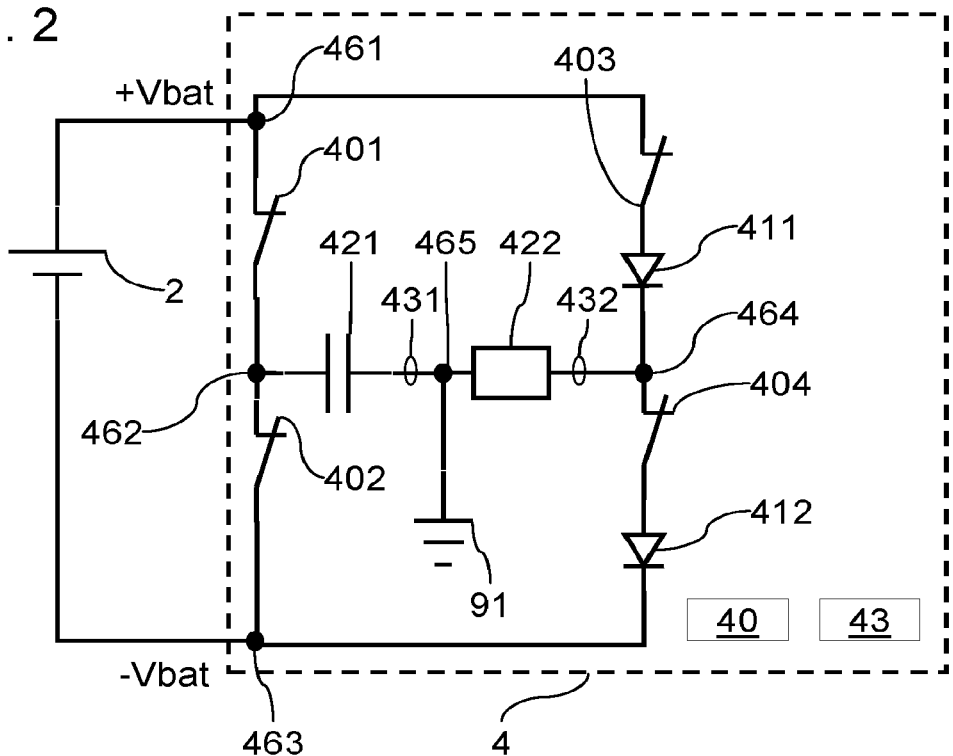
FIG. 2 is a schematic representation of an insulation fault detection device implemented in one embodiment of the invention.

FIG. 2 is a schematic representation of one example of an insulation fault detection device 4 according to one embodiment of the invention, attached to the battery 2. The insulation fault detection device 4 comprises a bridge configuration having first to fourth nodes 461 to 464. A first branch electrically connects the nodes 461 and 462 and comprises a first controlled switch 401. A second branch electrically connects the nodes 462 and 463 and comprises a second controlled switch 402. A third branch electrically connects the nodes 461 and 464 and comprises a third switch 403. This third switch 403 is advantageously connected in series with a first element having unidirectional conduction 411. A fourth branch electrically connects the nodes 464 and 463 and comprises a fourth switch 404. This fourth switch 404 is advantageously connected in series with a second element with unidirectional conduction 412. A fifth branch electrically connects the nodes 462 and 464. A capacitor 421 and a resistive load 422 are connected between the nodes 462 and 464 in the fifth branch. A node 465 intermediate between the capacitor 421 and the resistive load 422 is connected to the potential of the mechanical ground 91. A current sensor 431 advantageously measures the current flowing through the capacitor 421. A current sensor 432 advantageously measures the current flowing through the resistive load 422. The insulation fault detection device 4 comprises a detection circuit 43. The detection circuit 43 determines an insulation fault and also potentially its amplitude depending on measurements.

The potential +Vbat of the battery 2 is applied to the node 461. The potential −Vbat of the battery 2 is applied to the node 463. The controlled switches 401 to 404 are configured for selectively interrupting the conduction within their respective branch. The opening and the closing of the switches 401 to 404 is controlled by a control circuit 40. The controlled switches 401 to 404 are for example field-effect transistors whose gate is controlled by the control circuit 40. Some examples of control mode of the switches 401 to 404 by the control circuit 40 will be detailed in the following. The unidirectional conduction element 411 only allows a conduction from the node 461 toward the node 464. The unidirectional conduction element 412 only allows a conduction from the node 464 toward the node 463. The unidirectional conduction elements 411 and 412 are, in this case, diodes. By means of the switch 403, the anode of the diode 411 is connected to the node 461 and the cathode of the diode 411 is connected to the node 464. By means of the switch 404, the anode of the diode 412 is connected to the node 464 and the cathode of the diode 412 is connected to the node 463.

Figure 3:
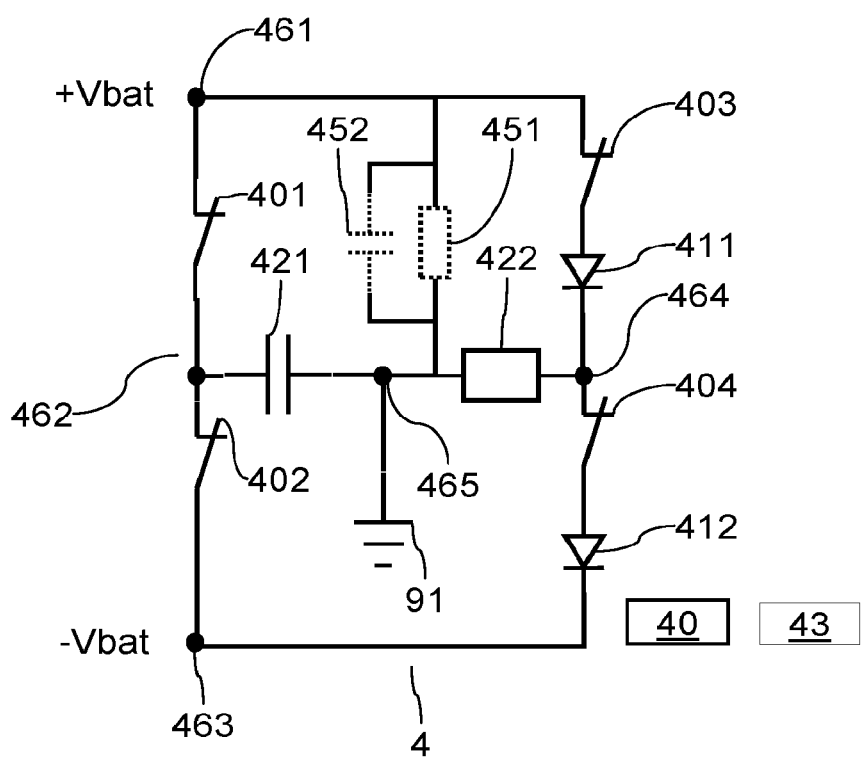
FIG. 3 is an electrical circuit diagram of a vehicle equipped with a detection device, in the presence of one type of insulation fault.

FIG. 3 is an electrical circuit diagram of a vehicle equipped with a detection device 4 in the presence of one example of insulation fault between the mechanical ground 91 and the positive terminal of the battery 2. The resistance 451 connected between the node 461 and the node 465 is representative of an insulation fault resistance between the positive terminal of the battery 2 and the mechanical ground 91. The capacitor 452 connected between the node 461 and the node 465 in parallel with the resistance 451 is representative either of the stray capacitances between the positive terminal of the battery 2 and ground 91, or representative of interference suppression capacitances of the vehicle, or representative of a combination of the two.

Figure 4:
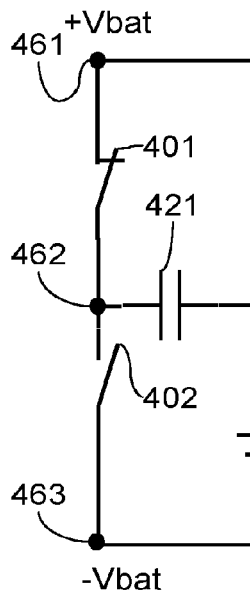
FIGS. 4 and 5 illustrate successive configurations of the detection device in FIG. 2 for a first type of test.
Figure 5:
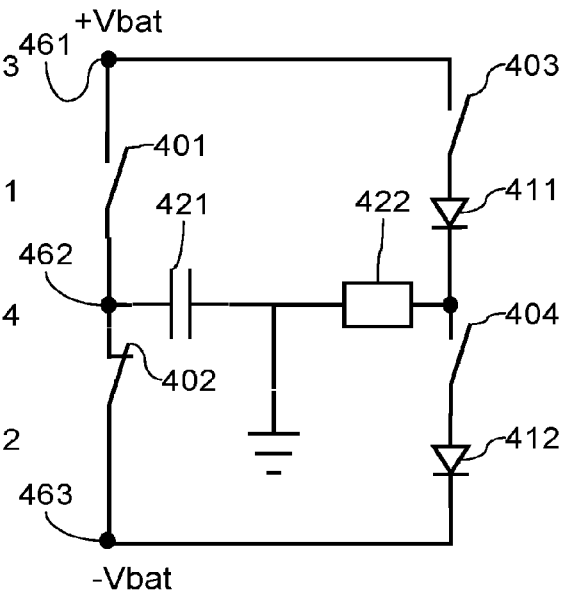

FIGS. 4 and 5 illustrate successive configurations of the switches of the bridge configuration of the insulation fault detection device 4 during a test for insulation fault with respect to the positive terminal of the battery 2.

Initially, in the absence of an insulation fault test, the control circuit 40 maintains the set of switches 401 to 404 simultaneously open, so as to eliminate the electrical power consumption of the detection device 4. Advantageously, the switches 401 to 404 will be maintained simultaneously open with a duty cycle equal to at least 98%, and preferably equal to at least 99%.

In FIG. 4, an insulation fault test is initiated between the positive terminal of the battery 2 and the mechanical ground 91. The capacitor 421 is assumed to be initially discharged. The control circuit 40 then closes the switches 401 and 404 and maintains the switches 402 and 403 open during a first step. The potential difference across the terminals of the battery 2 is applied to the terminals of the fifth branch (ignoring the voltage drop inside the switches 401 and 404). During this first step, the capacitor 421 is charged up, a charge current being supplied by the battery 2 and flowing through the switches 401 and 404. Advantageously, this first step is of sufficient duration for the potential difference Vc across the terminals of the capacitor 421 to reach at least a value E/2, with E being the potential difference across the terminals of the battery 2. Preferably, this first step is of a sufficient duration for the potential difference across the terminals of the capacitor 421 to reach at least the value 0.9*E, or even E.

Following this first step for charging the capacitor 421, the control circuit 40 initiates a second step for testing the insulation fault between the positive terminal of the battery 2 and ground 91. The control circuit 40 then closes the switch 402 and maintains the switches 401, 403 and 404 open. The capacitor 421 and the battery 2 are then connected in series between the node 461 and ground (node 465) such that the potential difference between the nodes 461 and 465 corresponds to the algebraic sum of E (the potential difference across the terminals of the battery 2) and Vc (the potential difference across the terminals of the capacitor 421). A potential difference Vc+E is thus applied between ground 91 and the node 461.

Figure 6:
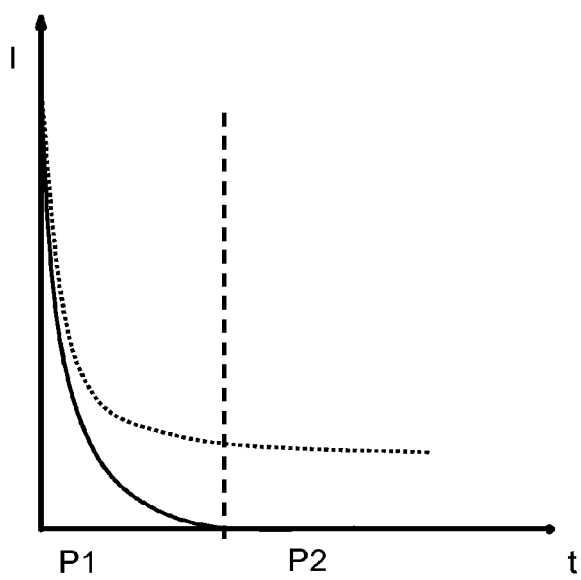
FIG. 6 is a diagram illustrating the current through a capacitor of the detection device.

In the presence of an insulation fault resistance 451 or of the capacitor 452, the latter allows a circuit for discharging the capacitor 421 to be formed between the node 461 and the node 465. The diagram in FIG. 6 illustrates the current flowing through the capacitor 421 during this second step. The assumption may be made here that the capacitor 421 has a capacitance much higher than that of the capacitor 452, typically at least four times higher. During a first phase P1, the capacitor 452 is charged and its influence is dominant on the shape of the discharge curve of the capacitor 421, whereas the current through the insulation fault resistance is negligible. The discharge current of the capacitor 421 decreases exponentially, the charge transferred during this phase being proportional to the value of capacitance of the capacitor 452. In a second phase P2, the discharge current of the capacitor 421 stabilizes to a virtually constant value, owing to an exponential discharge with a time constant much longer than a measurement period. This stabilized value defines the value of the insulation fault resistance 451. In the absence of insulation fault resistance 451, the discharge current becomes zero in the phase P2 (dashed curve). The stabilization of the discharge current is of course an approximation assuming that the capacitor 421 has an infinite capacitance.

According to a first variant, by continuing the discharge of the capacitor 421 during the phase P2, the circuit 43 can determine the presence of an insulation fault resistance and its amplitude, based on a measurement of current flowing through the capacitor 421 (by means of the sensor 431) at a given time after the closing of the switch 402. This insulation fault resistance is then proportional to the stabilized discharge current of the capacitor 421 during the phase P2. Depending on the voltage across the terminals of the capacitor 421 at a given time during the phase P1, it is also possible to determine the value of capacitance of the capacitor 452. Indeed, it may be considered that the discharge of the capacitor 421 during the phase P1 essentially ensures the charging of the capacitor 452.

According to a second variant, the value of the capacitance of the capacitor 452 is determined by measuring the residual charge of the capacitor 421. At the end of the phase P1, the discharge current of the capacitor 451 remains representative of the insulation fault resistance. In order to measure the capacitance of the capacitor 452, the control circuit 40 closes the switches 402 and 403 and opens the switches 401 and 404 at the end of the phase P1. By measuring the current (measured by the sensor 432) flowing through the resistive load 422 (whose value of resistance will then be calibrated), the circuit 43 determines the residual charge in the capacitor 421. This configuration of the switches 402 and 403 furthermore allows the capacitor 421 to be discharged for a later test step, for example for the test of the other polarity of the battery. Furthermore, the residual charge of the capacitor 421 is then at least partially recovered by the battery 2 during this discharge process.

The first and second variants may both be implemented by the detection device 4, for example for the sake of redundancy.

The determination of the capacitance of the capacitor 452 allows for example the amplitude of the stray capacitances, or the aging of an interference suppression capacitor to be determined.

The invention thus allows a detection of an insulation fault to be carried out:
  with a high potential between one terminal of the battery 2 and ground 91 irrespective of the level of charge of the battery;
  with a potential higher than the nominal voltage of the battery, by means of a simple structure;
  with an extremely reduced electrical power consumption.

In the example previously detailed, the resistive load also has the role of limiting the charging current of the capacitor 421 during the first step. This limitation notably provides a protection for the battery 2.

The unidirectional conduction elements 411 and 412 are used to prevent a current from flowing in the parasitic diodes of the switches 403 and 404, respectively, when the latter are incapable of withstanding a reverse voltage (for example for switches 403 and 404 in the form of MOSFET transistors).

Figure 7:
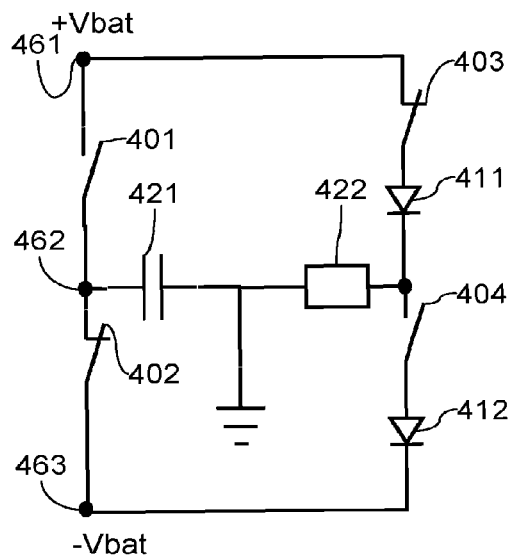
FIGS. 7 and 8 illustrate successive configurations of the detection device in FIG. 2 for a second type of test.
Figure 8:
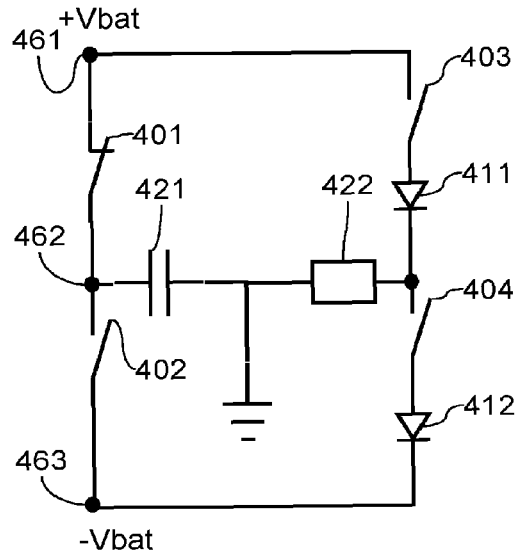

FIGS. 7 and 8 illustrate successive configurations of the switches of the bridge configuration of the insulation fault detection device 4 during an insulation fault test with respect to the negative terminal of the battery 2.

In FIG. 7, the insulation fault test between the negative terminal of the battery 2 and the mechanical ground 91 is initiated. The capacitor 421 is assumed to be initially discharged. The control circuit 40 then closes the switches 402 and 403 and maintains the switches 401 and 404 open during a first step. The potential difference across the terminals of the battery 2 is applied to the terminals of the fifth branch. During this first step, the capacitor 421 charges up, a charging current being supplied by the battery 2 and flowing through the switches 402 and 403.

Following this first step for charging the capacitor 421, the control circuit 40 initiates a second step for testing the insulation fault between the negative terminal of the battery 2 and ground 91. The control circuit 40 then closes the switch 401 and maintains the switches 402, 403 and 404 open. The capacitor 421 and the battery 2 are then connected in series between the node 463 and ground (node 465) such that the potential difference between the nodes 463 and 465 corresponds to the algebraic sum of the potential difference E across the terminals of the battery 2 and of the potential difference Vc across the terminals of the capacitor 421. A potential difference Vc+E is thus applied between ground 91 and the node 463.

The strategies according to the first and second variants described beforehand may also be used for measuring an insulation fault and/or the capacitance of the capacitor 452 between the negative terminal of the battery 2 and ground 91.

In operation, the capacitor 421, the unidirectional conduction elements 411 and 412, and the switches 401 and 402 are subjected to a potential difference with a value of E. The resistive load 422 and the switches 403 and 404 are subjected to a potential difference with a value of 2*E. Those skilled in the art will be able to design the dimensions of these components accordingly. The resistive load 422 could advantageously have a resistance equal to at least 100 kΩ. The resistive load 422 illustrated in the various variants allows the amplitude of the current flowing through the capacitor 421 to be reduced. However, the invention may also be implemented without such a load.

For an automobile vehicle, the insulation fault tests may be carried out in a periodic manner or as one-off tests, while the vehicle is being driven or is stopped.

The invention claimed is:

1. A device for detecting an insulation fault between a source of DC voltage and an electrical ground, comprising:
a bridge configuration comprising:
first, second, third, and fourth nodes, the first and third nodes being configured to be connected to the terminals of a high-power source of DC voltage;
a first branch connecting the first and second nodes, and comprising a first controlled switch configured for selectively interrupting the conduction in the first branch;
a second branch connecting the second and third nodes, and comprising a second controlled switch configured for selectively interrupting the conduction in the second branch;
a third branch connecting the first and fourth nodes, and comprising a third controlled switch configured for selectively interrupting the conduction in the third branch;
a fourth branch connecting the third and fourth nodes and comprising a fourth controlled switch configured for selectively interrupting the conduction in the fourth branch;
a fifth branch connecting the second and fourth nodes, the fifth branch comprising a capacitor connected between the second and fourth nodes, an electrical ground being connected to the fifth branch between the capacitor and the fourth node;
a control circuit controlling the switches to carry out:
a) maintaining the first and fourth switches closed and the second and third switches open, to charge the capacitor;
b) maintaining the second switch closed and the first, third, and fourth switches open;
a first measurement circuit measuring current flowing through the capacitor;
an analyzer circuit determining amplitude of an insulation fault as a function of a current measured by the measurement circuit during the b) maintaining.

2. The insulation fault detection device as claimed in claim 1, wherein the fifth branch further comprises a resistive load connected between ground potential and the fourth node.

3. The insulation fault detection device as claimed in claim 1, further comprising a circuit determining residual charge in the capacitor after the b) maintaining, the analyzer circuit determining a value of capacitance between the first node and the electrical ground as a function of the determined residual charge.

4. The insulation fault detection device as claimed in claim 2, further comprising a second measurement circuit measuring current flowing through the resistive load, and wherein the control circuit controls the switches to carry out c) following the b) maintaining, c) including maintaining the second and third switches closed and the first and fourth switches open, the circuit for determining the residual charge determining the residual charge in the capacitor as a function of the current measured through the second measurement circuit during c).

5. The insulation fault detection device as claimed in claim 1, wherein the control circuit further controls the switches to carry out:
d) maintaining the second and third switches closed and the first and fourth switches open, to charge the capacitor;
e) maintaining the first switch closed and the second, third and fourth switches open;
the analyzer circuit further configured to determine amplitude of an insulation fault as a function of current measured by the measurement circuit during the e) maintaining.

6. The insulation fault detection device as claimed in claim 1, wherein:
the third branch further comprises a first element with unidirectional conduction from the first node toward the fourth node and connected in series with the third switch;
the fourth branch further comprises a second element with unidirectional conduction from the fourth node toward the third node and connected in series with the fourth switch.

7. The insulation fault detection device as claimed in claim 1, wherein the third and fourth switches are transistors of MOSFET type.

8. The insulation fault detection device as claimed in claim 1, wherein the control circuit is configured to maintain the first to fourth switches simultaneously open with a duty cycle equal to at least 98%.

9. A system comprising:
a high-power source of DC voltage;
an insulation fault detection device as claimed in claim 1 whose first and third nodes are connected to terminals of the high-power source of DC voltage, the electrical ground being insulated with respect to the terminals of the source of DC voltage.

10. The system as claimed in claim 9, wherein the control circuit is configured to implement the a) maintaining for a period of time that is sufficiently long for the voltage across the terminals of the capacitor charged after the a) maintaining is equal to at least 0.5* E, with E being the voltage across the terminals of the source of DC voltage.

* * * * *